(12) United States Patent
Kuang et al.

(10) Patent No.: US 10,283,051 B2
(45) Date of Patent: May 7, 2019

(54) OLED PIXEL DRIVING CIRCUIT AND OLED DISPLAY DEVICE

(71) Applicant: Shenzhen China Star Optoelectronics Semiconductor Display Technology Co., Ltd., Shenzhen (CN)

(72) Inventors: Jimu Kuang, Shenzhen (CN); Hongjun Xie, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/735,201

(22) PCT Filed: Nov. 27, 2017

(86) PCT No.: PCT/CN2017/113032
§ 371 (c)(1),
(2) Date: Dec. 11, 2017

(65) Prior Publication Data
US 2019/0073954 A1    Mar. 7, 2019

(30) Foreign Application Priority Data
Sep. 6, 2017 (CN) .......................... 2017 1 0797949

(51) Int. Cl.
*G09G 3/3258* (2016.01)
*H01L 27/32* (2006.01)
(Continued)

(52) U.S. Cl.
CPC ......... *G09G 3/3258* (2013.01); *G09G 3/3266* (2013.01); *G09G 3/3291* (2013.01);
(Continued)

(58) Field of Classification Search
None
See application file for complete search history.

(56) References Cited

U.S. PATENT DOCUMENTS

2011/0122119 A1* 5/2011 Bae ...................... G09G 3/3233
345/211
2016/0098961 A1* 4/2016 Han ...................... G09G 3/3291
345/691
(Continued)

FOREIGN PATENT DOCUMENTS

CN        105489159 A    4/2016
CN        105788530 A    7/2016
(Continued)

*Primary Examiner* — Kent W Chang
*Assistant Examiner* — Benjamin Morales
(74) *Attorney, Agent, or Firm* — Leong C. Lei

(57) ABSTRACT

The invention provides an OLED pixel driving circuit and OLED display device. The OLED pixel driving circuit uses 5T1C structure and switch (K). By switch signal (Switch) controlling the switch (K) to connect first pin (K1) and second pin (K2) to enter display mode, and to connect first pin (K1) and third pin (K3) to enter sense mode, the ADC (ADC) senses the threshold voltage of the fourth TFT (T4), converted and used for data compensation in the display mode, able to compensate and eliminate the impact of threshold voltage of the fourth TFT (T4) on the current flowing through the OLED (D1); the light-emitting control signal (EM) controls the fifth TFT (T5) connected to the OLED (D1) to cut off during the data writing stage (t1) to keep the data signal voltage and the gate voltage of the fourth TFT (T4) unaffected by the OLED (D1) threshold voltage.

9 Claims, 6 Drawing Sheets

(51) Int. Cl.
*G09G 3/3291* (2016.01)
*H01L 51/52* (2006.01)
*G09G 3/3266* (2016.01)

(52) U.S. Cl.
CPC ...... *H01L 27/3262* (2013.01); *H01L 27/3265* (2013.01); *H01L 51/5206* (2013.01); *H01L 51/5221* (2013.01); *G09G 2300/043* (2013.01); *G09G 2310/0278* (2013.01)

(56) References Cited

U.S. PATENT DOCUMENTS

2018/0151099 A1* 5/2018 Choi .................... H01L 27/1225
2018/0301090 A1* 10/2018 Kuang ................. G09G 3/3233

FOREIGN PATENT DOCUMENTS

| | | |
|---|---|---|
| CN | 106157895 A | 11/2016 |
| CN | 106652911 A | 5/2017 |
| KR | 20100069427 A | 6/2010 |

* cited by examiner

OLED PIXEL DRIVING CIRCUIT AND OLED DISPLAY DEVICE

BACKGROUND OF THE INVENTION

1. Field of the Invention

The present invention relates to the field of display techniques, and in particular to an OLED pixel driving circuit and an OLED display device.

2. The Related Arts

The organic light emitting diode (OLED) provides the advantages of active-luminescent, low driving voltage, high emission efficiency, quick response time, high resolution and contrast, near 180° viewing angle, wide operation temperature range, and capability to realize flexible display and large-area full-color display, and is heralded as the most promising display technology.

The OLED is an electroluminescent device driven by electric current; that is, when a current flows through OLED, the OLED illuminates, and the brightness is determined by the current flowing through the OLED. The majority of known integrated circuit (IC) only transmits the voltage signal, and the pixel driving circuit of the OLED display must accomplish the task of translating the voltage signal into a current signal. The conventional pixel driving circuit usually uses a 2T1C structure, i.e., two thin film transistors (TFT) and a capacitor, to translate the voltage into current.

As shown in FIG. 1, a conventional 2T1C pixel driving circuit for driving OLED device comprises: a first TFT T10, second TFT T20, and a capacitor C10. The first TFT T10 is a switching TFT, the second TFT T20 is a driving TFT, and the capacitor T10 is a storage capacitor. Specifically, the first TFT T10 has a gate connected to receive a scan signal Scan, a drain connected to receive a data signal Data, and a source electrically connected to a gate of the second TFT T20 and to one end of the capacitor C10. The second TFT T20 has a drain connected to receive a voltage OVDD of a power source, and a source connected to receive an anode of the OLED D10; the OLED D10 has a cathode connected to receive a common ground voltage OVSS; the capacitor C10 has one end electrically connected to the gate of the second TFT T20, and the other end electrically connected to the source of the second TFT T20. When the OLED displays, the scan signal Scan controls the first TFT T10 to be turned on, the data signal Data passes through the first TFT T10 and enters the gate of the second TFT T20 and the capacitor C10. Then, the first TFT T10 is cut off. Because of the storage of the capacitor C10, the gate voltage of the second TFT T20 stays at the data signal voltage level so that the second TFT T20 stays turned on. The driving current flows through the second TFT T20 to enter the OLED D10 and drives the OLED D10 to emit light.

According to the equation calculating the current flowing through the driving TFT and the OLED:

$$I_{OLED}=K \times (Vgs-Vth)^2;$$

Wherein $I_{OLED}$ is the current flowing through the driving TFT and the OLED, K is the intrinsic conductive factor, of the driving TFT, Vgs is the voltage difference across the gate and the source of the driving TFT, and Vth is the threshold voltage of the driving TFT. As seen, the size of $I_{OLED}$ is related to the threshold voltage Vth of the driving TFT.

The above conventional OLED pixel driving circuit is simple in structure, and without a compensation function, and therefore has many shortcomings. The most prominent shortcoming is that the non-uniformity of the TFT fabrication process, the threshold voltages of the driving TFTs of all pixels in the OLED display device will be inconsistent. Moreover, due to long operation time, the ageing of the driving TFT will cause voltage drift of the threshold voltage of the driving TFTs, leading to display unevenness.

The known technologies also include some OLED pixel driving circuit able to sense the threshold voltage of the driving pixel and compensate the threshold voltage to the data signal. However, the voltage of the data signal is affected by the threshold voltage of the OLED. On one hand, the threshold voltage of the OLED must be about 10V, and the light-emitting layer in the OLED must adopt the 3-layered or 4-layered structure. On the other hand, the data signal voltage cannot be higher than the OLED threshold voltage during the data writing stage to ensure that the OLED will not emit light during the data writing stage. Moreover, the gate voltage of the driving TFT is also affected by the OLED threshold voltage and is required to have a voltage level not greater than the sum of the OLED threshold voltage and the driving TFT threshold voltage.

SUMMARY OF THE INVENTION

The object of the present invention is to provide an OLED pixel driving circuit, not only able to compensate, but also to eliminate the impact of the threshold voltage of the driving TFT on the current flowing through the OLED, and achieve uniform display and improve image quality, as well as, keep the data signal voltage and the gate voltage of the driving TFT unaffected by the OLED threshold voltage.

Another object of the present invention is to provide an OLED display device, with pixel driving circuit able to compensate, improve display uniformity, and keep the data signal voltage and the gate voltage of the driving TFT unaffected by the OLED threshold voltage.

To achieve the above object, the present invention provides an OLED pixel driving circuit, comprising: a first thin film transistor (TFT), a second TFT, a third TFT, a fourth TFT, a fifth TFT, a capacitor, an OLED, and a switch, a DAC and an ADC disposed in a driving IC, operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT.

According to a preferred embodiment of the present invention, in the data writing stage of the display mode, the scan signal is at high voltage, the common ground voltage is at low voltage, and the data signal is at high voltage; in the light-emitting stage of the display mode, the scan signal is at low voltage, the common ground voltage is at low voltage, and the data signal is at high voltage;

in the sense mode, the scan signal first provides a high voltage pulse and then maintains at low voltage; the sensing control signal first provides a high voltage pulse synchronized with the high voltage pulse of the scan signal and then maintains at low voltage; the common ground voltage always stays at low voltage; and the light-emitting control signal always stays at low voltage.

According to a preferred embodiment of the present invention, a resistance of the first TFT and a resistance of the second TFT have a ratio relation.

According to a preferred embodiment of the present invention, the driving IC presets a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT has a voltage equal to the sum of the maximum of the data signal voltage and the threshold voltage of the fourth TFT.

The present invention also provides an OLED display device, which comprises an OLED pixel driving circuit; the OLED pixel driving circuit further comprising: a first thin film transistor (TFT), a second TFT, a third TFT, a fourth TFT, a fifth TFT, a capacitor, an OLED, and a switch, a DAC and an ADC disposed in a driving IC, operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT.

According to a preferred embodiment of the present invention, in the data writing stage of the display mode, the scan signal is at high voltage, the common ground voltage is at low voltage, and the data signal is at high voltage; in the light-emitting stage of the display mode, the scan signal is at low voltage, the common ground voltage is at low voltage, and the data signal is at high voltage;

in the sense mode, the scan signal first provides a high voltage pulse and then maintains at low voltage; the sensing control signal first provides a high voltage pulse synchronized with the high voltage pulse of the scan signal and then maintains at low voltage; the common ground voltage always stays at low voltage; and the light-emitting control signal always stays at low voltage.

According to a preferred embodiment of the present invention, a resistance of the first TFT and a resistance of the second TFT have a ratio relation.

According to a preferred embodiment of the present invention, the driving IC presets a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT has a voltage equal to the sum of the maximum of the data signal voltage and the threshold voltage of the fourth TFT.

The present invention further provides an OLED pixel driving circuit, which comprises: a first thin film transistor (TFT), a second TFT, a third TFT, a fourth TFT, a fifth TFT, a capacitor, an OLED, and a switch, a DAC and an ADC disposed in a driving IC, operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT;

wherein in the data writing stage of the display mode, the scan signal being at high voltage, the common ground voltage being at low voltage, and the data signal being at high voltage; in the light-emitting stage of the display mode, the scan signal being at low voltage, the common ground voltage being at low voltage, and the data signal being at high voltage;

in the sense mode, the scan signal first providing a high voltage pulse and then maintaining at low voltage; the sensing control signal first providing a high voltage pulse synchronized with the high voltage pulse of the scan signal and then maintaining at low voltage; the common ground voltage always staying at low voltage; and the light-emitting control signal always staying at low voltage;

wherein a resistance of the first TFT and a resistance of the second TFT having a ratio relation;

wherein the driving IC presetting a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT having a voltage equal to the sum of the maximum of the data signal voltage and the threshold voltage of the fourth TFT.

Compared to the known techniques, the present invention provides the following advantages. The present invention provides an OLED pixel driving circuit with a 5T1C structure and using a switch. By the switch signal controlling the switch, the first pin and the second pin are connected to enter the display mode, and by the switch signal controlling the switch, the first pin and the third pin are connected to enter the sense mode, so that the ADC senses the threshold voltage of the fourth TFT, converted by ADC and used for data compensation in the display mode. As such, the invention is able to compensate and to eliminate the impact of the threshold voltage of the driving TFT on the current flowing through the OLED to achieve uniform display; the light-emitting control signal controls the fifth TFT connected to the OLED to cut off during the data writing stage to keep the data signal voltage and the gate voltage of the driving TFT unaffected by the OLED threshold voltage. The invention also provides an OLED display device, comprising the OLED pixel driving circuit, able to compensate improve display uniformity and keep the data signal voltage and the gate voltage of the driving TFT unaffected by the OLED threshold voltage.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
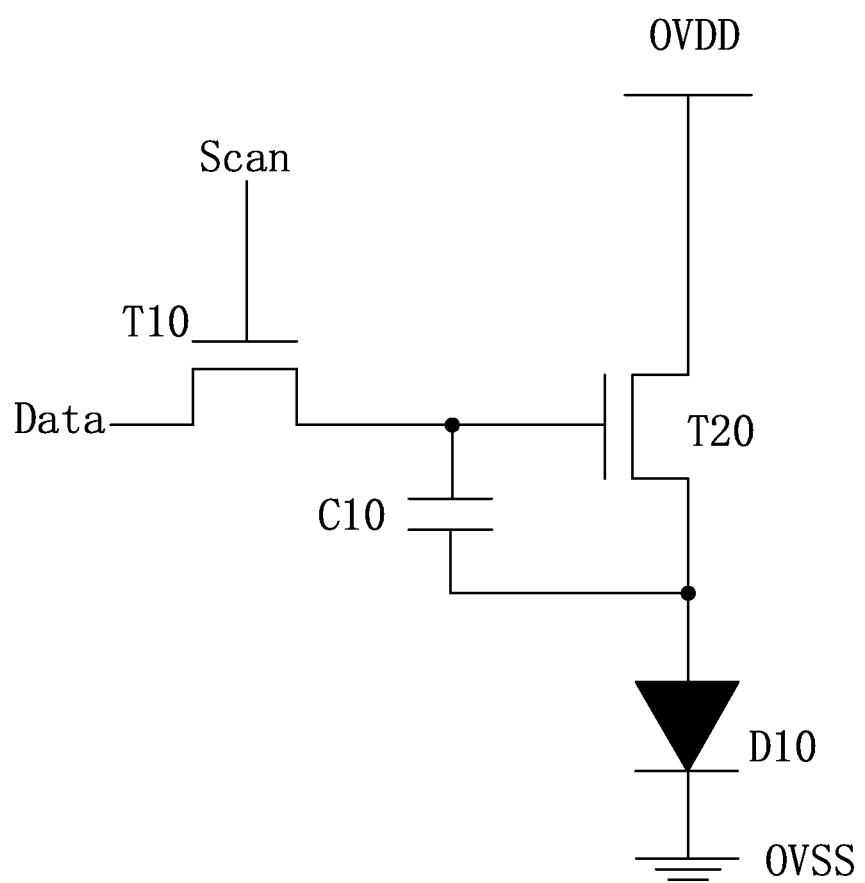
FIG. 1 is a schematic view showing a conventional OLED pixel driving circuit with 2T1C structure.
Figure 2:
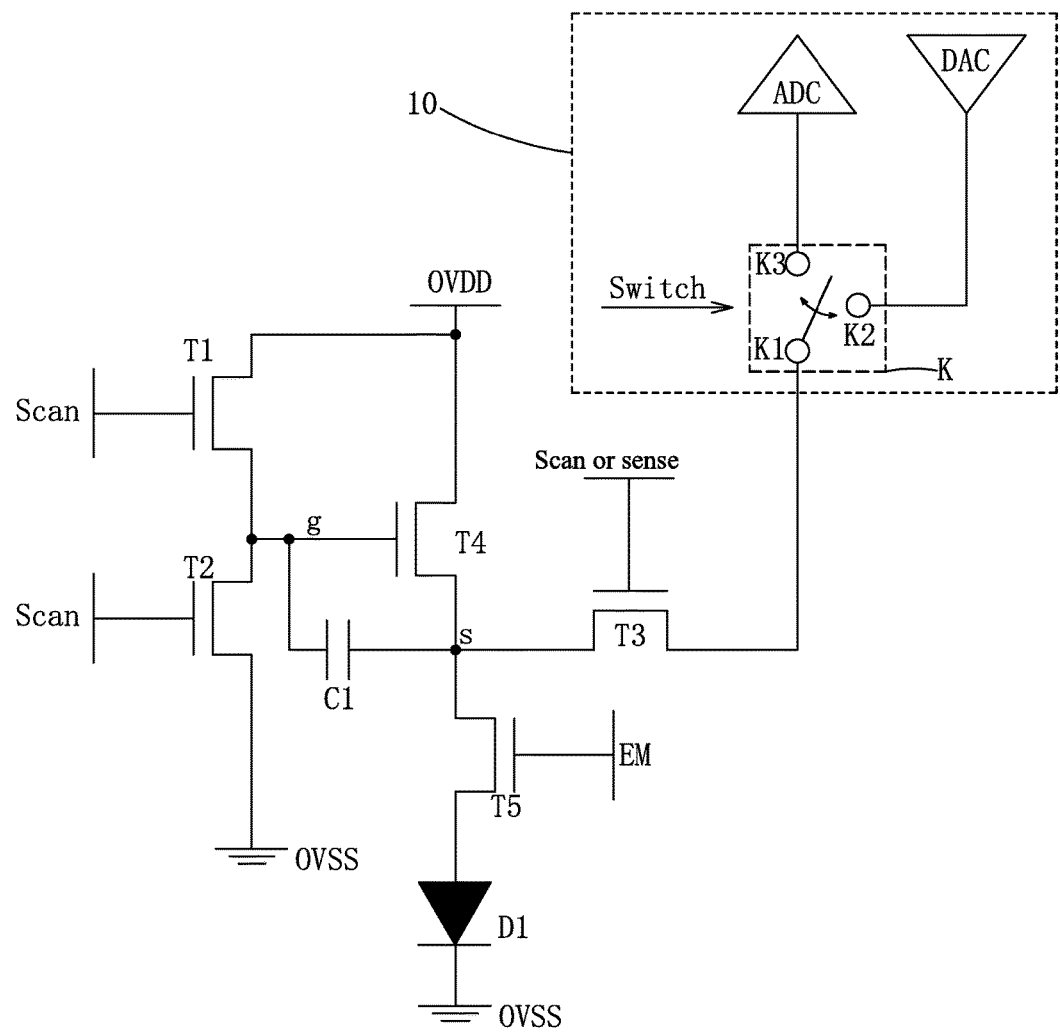
FIG. 2 is a schematic view showing an OLED pixel driving circuit provided by an embodiment of the present invention.
Figure 3:
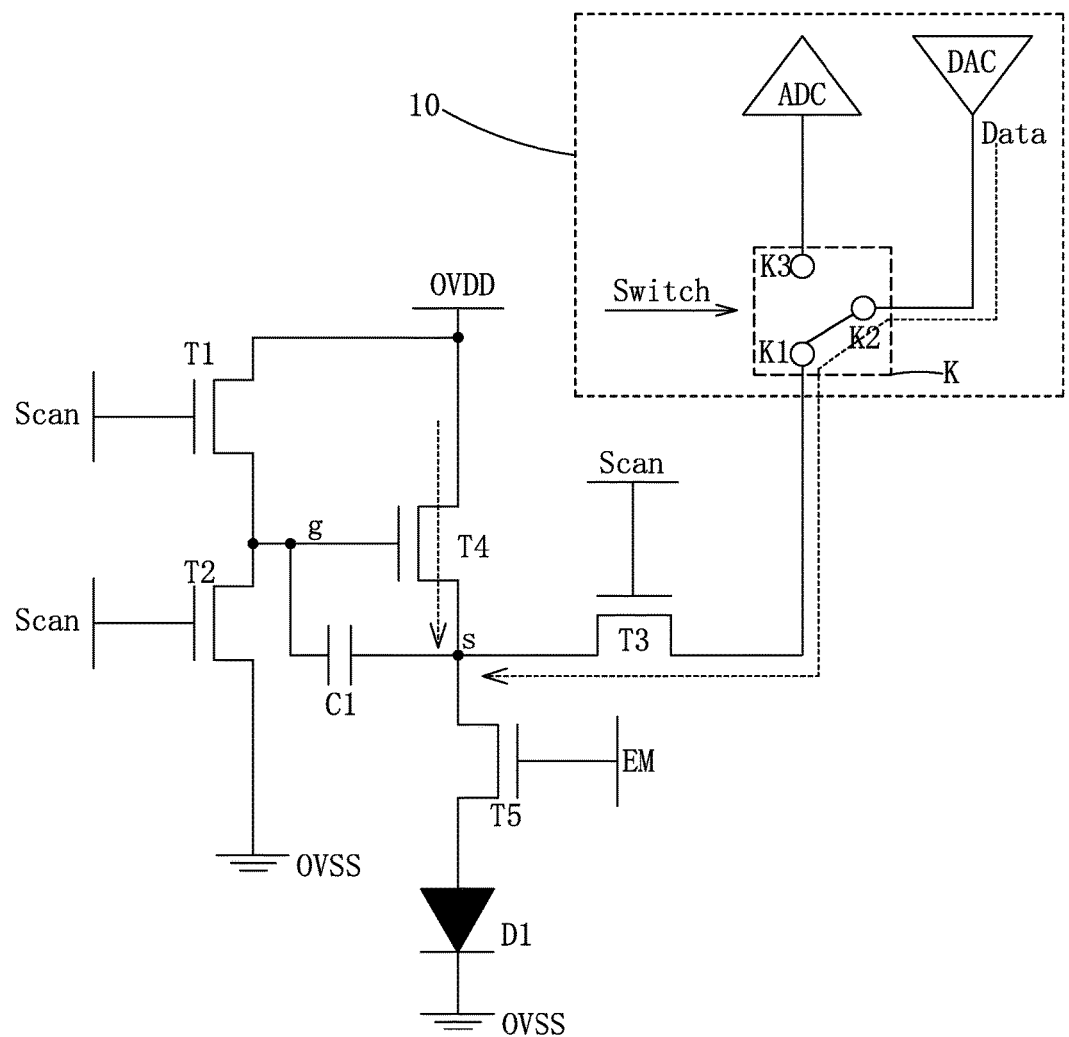
FIG. 3 is a schematic view showing the circuit connection in the display mode of the OLED pixel driving circuit provided by an embodiment of the present invention.
Figure 4:
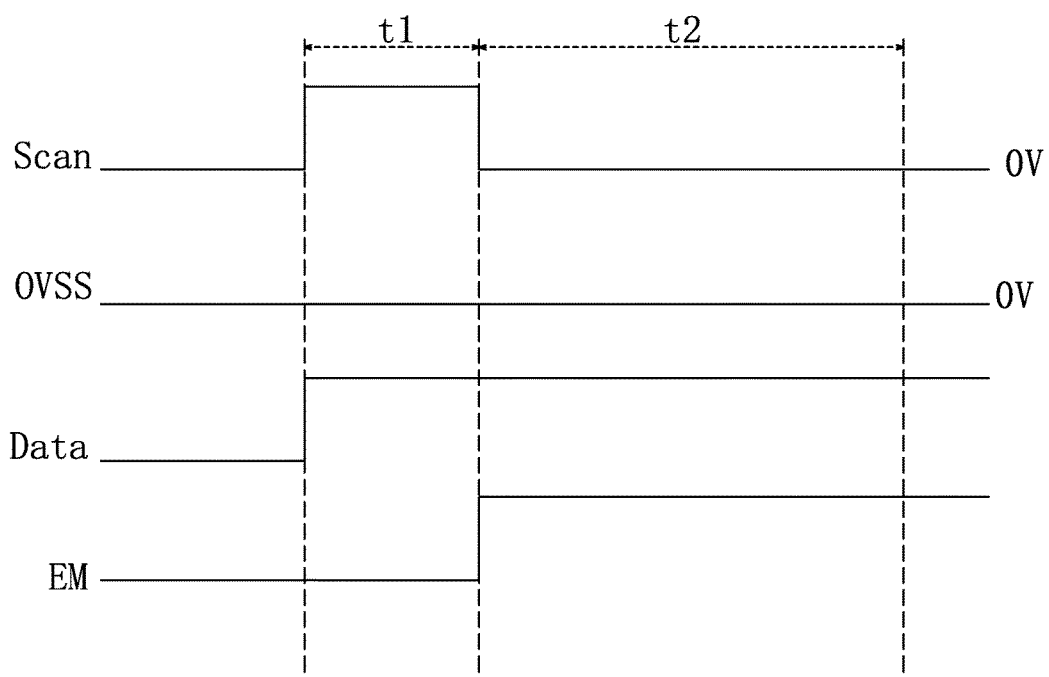
FIG. 4 is a schematic view showing the timing sequence in the display mode of the OLED pixel driving circuit provided by an embodiment of the present invention.
Figure 5:
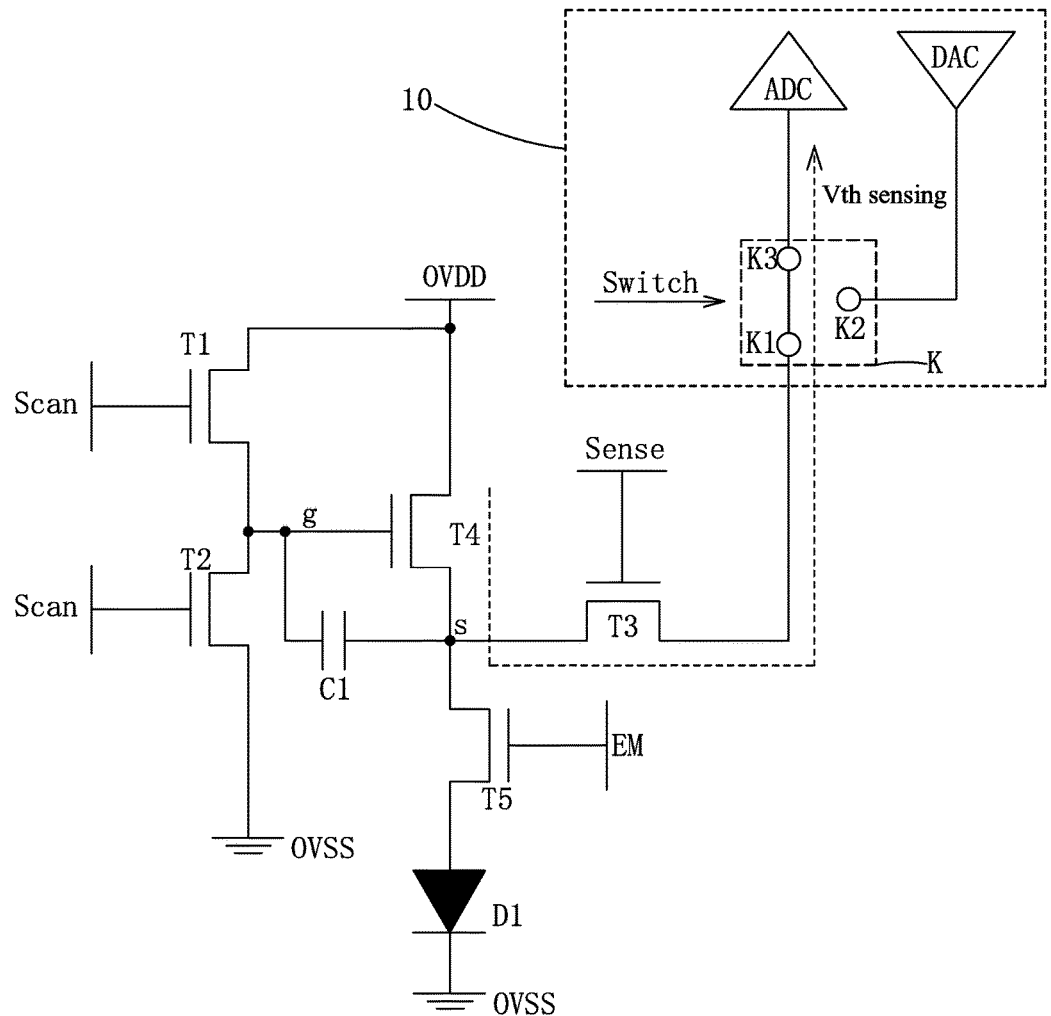
FIG. 5 is a schematic view showing the circuit connection in the sense mode of the OLED pixel driving circuit provided by an embodiment of the present invention.

Refer to FIG. 2 to FIG. 6. The present invention provides an OLED pixel driving circuit. As shown in FIG. 2, FIG. 3 and FIG. 5, the OLED pixel driving circuit comprises: a first thin film transistor (TFT) T1, a second TFT T2, a third TFT T3, a fourth TFT T4, a fifth TFT T5, a capacitor C1, an OLED D1, and a switch K, a digital-to-analog converter (DAC) DAC and an analog-to-digital converter (ADC) ADC disposed in a driving IC 10, wherein the fourth TFT T4 is the driving TFT directly driving the OLED D1.

The OLED pixel driving circuit uses a 5T1C structure, and disposes a switch K, wherein the operation states comprise a display mode and a sense mode.

Specifically, the switch K is control by a switch signal Switch, and comprises a first pin K1, a second pin K2, and a third pin K3.

The first TFT T1 has a gate connected to a scan signal Scan, a drain connected to a power source OVDD, and a source connected to a drain of the second TFT T2, a gate g of the fourth TFT T4, and an end of the capacitor C1. The second TFT T2 has a gate connected to the scan signal Scan, and a source connected to a common ground voltage OVSS. The fourth TFT T4 has a drain connected to a power source voltage OVDD, and a source s connected to a drain of the fifth TFT T5. The fifth TFT T5 has a gate connected to a light-emitting control signal EM, and a source connected to an anode of the OLED D1. The OLED D1 has a cathode connected to the common ground voltage OVSS. The capacitor C1 has the other end connected to the source s of the fourth TFT T4. The third TFT T3 has a gate connected to the scan signal Scan in the display mode and connected to the sensing control signal Sense in the sense mode, a source connected to the source s of the fourth TFT T4, and a drain connected to the first pin K1 of the switch K.

The switch K has the second pin K2 connected to the DAC DAC, and the third pin K3 connected to the ADC ADC.

The first TFT T1, the second TFT T2, the third TFT T3, and the fourth TFT T4 are all low temperature polysilicon (LTPS) TFTs, oxide semiconductor TFTs, or amorphous silicon (aSi) TFTs.

It should be noted that the resistance of the first TFT T1 and the resistance of the second TFT T2 have a specific ratio relation. When the first TFT T1 and the second TFT t2 are both turned on, the two TFTs perform voltage division on the power source voltage OVDD.

Refer to FIG. 3 and FIG. 4. In the display mode, the switch signal Switch controls the switch K to connect the first pin K1 and the second pin K2, and the DAC DAC provides the data signal Data. The display mode is further divided into a data writing stage t1 and a light-emitting stage t2.

In the data writing stage t1, the scan signal Scan is at high voltage so that the first TFT T1, the second TFT T2, and the third TFT T3 are all turned on; the light-emitting control signal EM is at low voltage so that the fifth TFT T5 is cut off. The common ground voltage OVSS is at low voltage, and the data signal is at high voltage.

the conductive first TFT T1 and the second TFT T2 perform voltage division on the power source voltage OVDD so that the voltage Vg at the gate g of the fourth TFT T4 is:

$$Vg=OVDD \times R_{T2}/(R_{T2}+R_{T1});$$

Wherein $R_{T1}$ is the resistance of the first TFT T1, and $R_{T2}$ is the resistance of the second TFT T2.

The data signal Data is written into the source s of the fourth TFT T4 through the first pin K1 and the second pin K2 of the switch K and the conductive third TFT T3, i.e., $Vs=V_{Data}$ (Vs is the voltage at the source s of the fourth TFT T4, and $V_{Data}$ is the voltage at the data signal Data.)

Because in the data writing stage t1, the light-emitting control signal EM cuts off the fifth TFT T5, which cuts off the connection between the anode of the OLED D1 and the source s of the fourth TFT T4 so that the OLED D1 will not emit light. Hence, the OLED D1 is required to have a specific higher threshold voltage to prevent the OLED D1 from emitting light, and the light-emitting layer inside the OLED D1 can be of a 2-layered, 3-layered, or 4-layered structure. The data signal Data is not required to have a voltage not higher than the threshold voltage of the OLED D1, and the gate voltage Vg of the fourth TFT T4 has to be not higher than the sum of the threshold voltage of the OLED D1 and the threshold voltage of the fourth TFT T4. As such, the voltage of the data signal Data and the gate voltage Vg of the fourth TFT T4 are not affected by the threshold voltage of the OLED D1.

In the light-emitting stage t2, the scan signal Scan is at low voltage so that the first TFT T1, the second TFT T2, and the third TFT T3 are all cut-off; the light-emitting control signal EM is at high voltage so that the fifth TFT T5 is turned on, and the anode of the OLED d1 is connected to the source s of the fourth TFT T4. The common ground voltage OVSS is at low voltage, and the data signal Data is at high voltage. Under the storage effect of the capacitor C1, the OLED D1 emits light to display.

It should be noted that the driving IC 10 presets a lowest grayscales to correspond to a highest voltage of the data signal Data, and a highest grayscales to correspond to a lowest voltage of the data signal Data; by adjusting the ratio between the resistance of the first TFT T1 and the resistance of the second TFT T2, the gate of the fourth TFT T4 has a voltage Vg equal to the sum of the maximum of the data signal voltage $Vmax_{Data}$ and the threshold voltage Vth of the fourth TFT T4.

$$Vg=OVDD \times R_{T2}/(R_{T2}+R_{T1})=Vmax_{Data}+Vth;$$

As such, the dark state display of the OLED display device has a better display quality.

Figure 6:
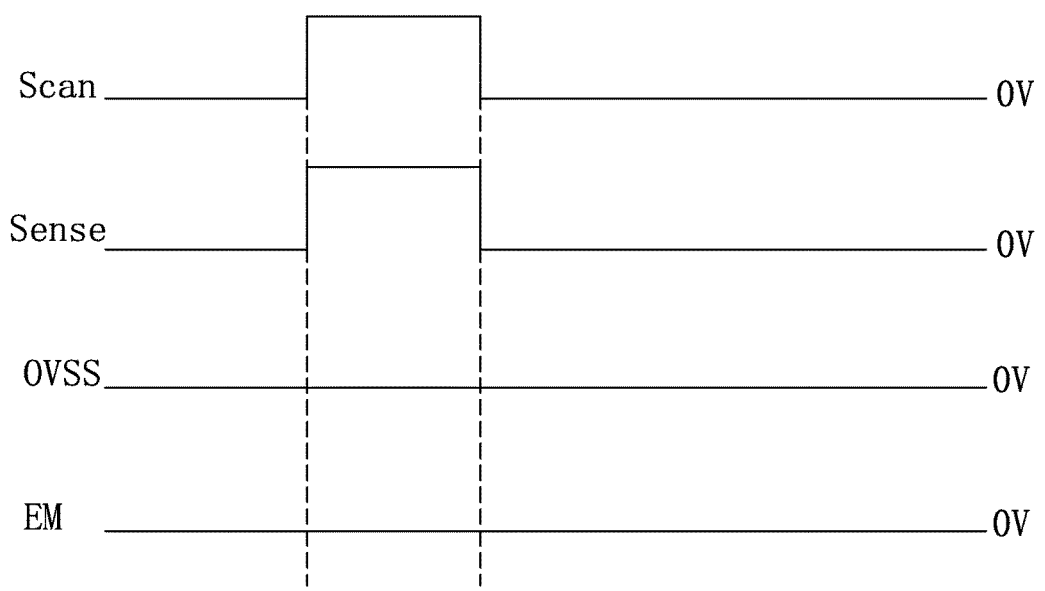
FIG. 6 is a schematic view showing the timing sequence in the sense mode of the OLED pixel driving circuit provided by an embodiment of the present invention.

Refer to FIG. 5 and FIG. 6. In the sense mode, the scan signal Scan first provides a high voltage pulse so that the first TFT T1 and the second TFT T2 are turned on. The conductive first TFT T1 and the second TFT T2 perform voltage division on the power source voltage OVDD so that the voltage Vg at the gate g of the fourth TFT T4 is:

$$Vg=OVDD \times R_{T2}/(R_{T2}+R_{T1}).$$

The light-emitting control signal EM stays always at low voltage to cut off the fifth TFT T5, which cuts of the connection between the anode of the OLED D1 and the source s of the fourth TFT T4 (i.e., the driving TFT) so that the OLED D1 does not emit light.

The common ground voltage OVSS always stays at low voltage.

The sensing control signal Sense first provides a high voltage pulse synchronized with the high voltage pulse of the scan signal Scan to turn on the third TFT T3. The switch signal Switch maintains the switch K to connect the first pin K1 and the second pin K2, the DAC first provides a low voltage signal written into the source s of the fourth TFT T4 through the first pin K1 and the second pin K2 of the switch K and the conductive third TFT T3. Then, the switch signal Switch controls the switch K to connect the first pin K1 and the third pin K3 of the switch K. At this point, because the he voltage Vg at the gate g of the fourth TFT T4 is $Vg=OVDD \times R_{T2}/(R_{T2}+R_{T1})$, and the source s is at a lower voltage, the fourth TFT T4 is conductive. The current flowing through the fourth TFT T4 enters the ADC ADC through the conductive third TFT T3, and the first pint K1 and the third pin K3 of the switch K, so that the ADC senses the threshold voltage Vth of the fourth TFT T4.

Then, the scan signal Scan and the sensing control signal Sense become low voltage and stay at low voltage.

After the ADC ADC senses the threshold voltage Vth of the fourth TFT T4 (i.e., the driving TFT), the ADC ADC converts the threshold voltage Vth into a digital sensing data and stores the digital sensing data for compensation in the display mode. Since because the threshold voltage Vth of the fourth TFT T4 (i.e., the driving TFT) in the display mode is compensated, the current flowing through the OLED D1 is independent of the threshold voltage Vth of the driving TFT, and the impact of the threshold voltage Vth of the driving TFT is eliminated, the display uniformity and the light-emitting efficiency are improved.

Based on the same structure, the invention also provides an OLED display device, comprising the aforementioned OLED pixel driving circuit. The details will not be repeated here.

In summary, the present invention provides an OLED pixel driving circuit with a 5T1C structure and using a switch. By the switch signal controlling the switch, the first pin and the second pin are connected to enter the display mode, and by the switch signal controlling the switch, the first pin and the third pin are connected to enter the sense mode, so that the ADC senses the threshold voltage of the fourth TFT, converted by ADC and used for data compensation in the display mode. As such, the invention is able to compensate and to eliminate the impact of the threshold voltage of the driving TFT on the current flowing through the OLED to achieve uniform display; the light-emitting control signal controls the fifth TFT connected to the OLED to cut off during the data writing stage to keep the data signal voltage and the gate voltage of the driving TFT unaffected by the OLED threshold voltage. The invention also provides an OLED display device, comprising the OLED pixel driving circuit, able to compensate improve display uniformity and keep the data signal voltage and the gate voltage of the driving TFT unaffected by the OLED threshold voltage.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An organic light-emitting diode (OLED) pixel driving circuit, comprising: a first thin film transistor (TFT), a second TFT, a third TFT, a fourth TFT, a fifth, a capacitor, an OLED, and a switch, a digital-to-analog converter (DAC) and an analog-to-digital converter (ADC) disposed in a driving integrated circuit (IC), operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT.

2. The OLED pixel driving circuit as claimed in claim 1, wherein in the data writing stage of the display mode, the scan signal is at high voltage, the common ground voltage is at low voltage, and the data signal is at high voltage; in the light-emitting stage of the display mode, the scan signal is at low voltage, the common ground voltage is at low voltage, and the data signal is at high voltage;

in the sense mode, the scan signal first provides a high voltage pulse and then maintains at low voltage; the sensing control signal first provides a high voltage pulse synchronized with the high voltage pulse of the scan signal and then maintains at low voltage; the common ground voltage always stays at low voltage; and the light-emitting control signal always stays at low voltage.

3. The OLED pixel driving circuit as claimed in claim 2, wherein a resistance of the first TFT and a resistance of the second TFT have a ratio relation.

4. The OLED pixel driving circuit as claimed in claim 3, wherein the driving IC presets a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT has a voltage equal to the sum of the maximum of the data signal voltage and the threshold voltage of the fourth TFT.

5. An organic light-emitting diode (OLED) display device, comprising an OLED pixel driving circuit; the OLED pixel driving circuit further comprising:

a first thin film transistor (TFT), a second TFT, a third TFT, a fourth TFT, a fifth, a capacitor, an OLED, and a switch, a digital-to-analog converter (DAC) and an analog-to-digital converter (ADC) disposed in a driving integrated circuit (IC), operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT.

6. The OLED display device as claimed in claim 5, wherein in the data writing stage of the display mode, the scan signal is at high voltage, the common ground voltage is at low voltage, and the data signal is at high voltage; in the light-emitting stage of the display mode, the scan signal is at low voltage, the common ground voltage is at low voltage, and the data signal is at high voltage;

in the sense mode, the scan signal first provides a high voltage pulse and then maintains at low voltage; the sensing control signal first provides a high voltage pulse synchronized with the high voltage pulse of the scan signal and then maintains at low voltage; the common ground voltage always stays at low voltage; and the light-emitting control signal always stays at low voltage.

7. The OLED display device as claimed in claim 6, wherein a resistance of the first TFT and a resistance of the second TFT have a ratio relation.

8. The OLED display device as claimed in claim 7, wherein the driving IC presets a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT has a voltage equal to the sum of the maximum of the data signal voltage and the threshold voltage of the fourth TFT.

9. An organic light-emitting diode (OLED) pixel driving circuit, comprising: a first thin film transistor (TFT), a second TFT, a third TFT, a fourth TFT, a fifth, a capacitor, an OLED, and a switch, a digital-to-analog converter (DAC) and an analog-to-digital converter (ADC) disposed in a driving integrated circuit (IC), operation states of the OLED pixel driving circuit comprising a display mode and a sense mode;

the switch being controlled by a switch signal, comprising a first pin, a second pin, and a third pin;

the first TFT having a gate connected to a scan signal, a drain connected to a power source, and a source connected to a drain of the second TFT, a gate of the fourth TFT, and an end of the capacitor; the second TFT having a gate connected to the scan signal, and a source connected to a common ground voltage; the fourth TFT having a drain connected to a power source voltage, and a source connected to a drain of the fifth TFT; the fifth TFT having a gate connected to a light-emitting control signal and a source connected to an anode of the OLED; the OLED having a cathode connected to the common ground voltage; the capacitor having the other end connected to the source of the fourth TFT; the third TFT having a gate connected to the scan signal in the display mode and connected to the sensing control signal in the sense mode, a source connected to the source of the fourth TFT, and a drain connected to the first pin of the switch;

the switch having the second pin connected to the DAC, and the third pin connected to the ADC;

in the display mode, the switch signal controlling the switch to connect the first pin and the second pin, and the DAC providing the data signal; the display mode being divided into a data writing stage and a light-emitting stage, and the light-emitting control signal is at low voltage to cut off the fifth TFT during the data writing stage, and at high voltage to turn on the fifth TFT during the light-emitting stage; in the sense mode, the DAC first providing a low voltage signal, and then the switch signal controlling the switch to connect the first pin and the third pin so that the ADC sensing a threshold voltage of the fourth TFT;

wherein in the data writing stage of the display mode, the scan signal being at high voltage, the common ground voltage being at low voltage, and the data signal being at high voltage; in the light-emitting stage of the display mode, the scan signal being at low voltage, the common ground voltage being at low voltage, and the data signal being at high voltage;

in the sense mode, the scan signal first providing a high voltage pulse and then maintaining at low voltage; the sensing control signal first providing a high voltage pulse synchronized with the high voltage pulse of the scan signal and then maintaining at low voltage; the common ground voltage always staying at low voltage; and the light-emitting control signal always staying at low voltage;

wherein a resistance of the first TFT and a resistance of the second TFT having a ratio relation;

wherein the driving IC presetting a lowest grayscales to correspond to a highest voltage of the data signal, and a highest grayscales to correspond to a lowest voltage of the data signal; by adjusting the ratio between the resistance of the first TFT and the resistance of the second TFT, the gate of the fourth TFT having a voltage equal to the sum of the maximum of the data signal voltage and the threshold voltage of the fourth TFT.

* * * * *